(12) United States Patent
Nakayama et al.

(10) Patent No.: US 10,393,774 B2
(45) Date of Patent: Aug. 27, 2019

(54) BUS BAR MODULE

(71) Applicant: TOYOTA JIDOSHA KABUSHIKI KAISHA, Toyota-shi, Aichi-ken (JP)

(72) Inventors: Wataru Nakayama, Toyota (JP); Kenji Goto, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 41 days.

(21) Appl. No.: 15/100,127

(22) PCT Filed: Dec. 3, 2014

(86) PCT No.: PCT/IB2014/002642
§ 371 (c)(1),
(2) Date: May 27, 2016

(87) PCT Pub. No.: WO2015/082980
PCT Pub. Date: Jun. 11, 2015

(65) Prior Publication Data
US 2017/0003323 A1  Jan. 5, 2017

(30) Foreign Application Priority Data
Dec. 6, 2013 (JP) ................................ 2013-253353

(51) Int. Cl.
*G01R 15/14* (2006.01)
*H02M 7/00* (2006.01)
(Continued)

(52) U.S. Cl.
CPC ......... *G01R 15/148* (2013.01); *G01R 15/207* (2013.01); *H02M 7/003* (2013.01); *H02M 2001/0009* (2013.01)

(58) Field of Classification Search
CPC ... G01R 15/148; G01R 15/207; H02M 7/003; H02M 2001/0009
See application file for complete search history.

(56) References Cited

U.S. PATENT DOCUMENTS 6,459,255 B1 * 10/2002 Tamai ................ G01R 15/202
324/117 H
7,768,083 B2 * 8/2010 Doogue ................ B82Y 25/00
257/422

(Continued)

FOREIGN PATENT DOCUMENTS

JP   2001-074783 A    3/2001
JP   2015-111079 A    6/2015
(Continued)

*Primary Examiner* — Akm Zakaria
(74) *Attorney, Agent, or Firm* — Sughrue Mion, PLLC

(57) ABSTRACT

A bus bar module equipped with a current sensor includes a first bus bar, a second bus bar, a substrate, and a first magnetoelectric transducer. The first bus bar has a first notch. The second bus bar has a second notch and is placed in parallel to the first bus bar. The second notch is provided at a position different from the first notch in an extending direction of the first bus bar. The substrate is fitted to both the first notch and the second notch. Further, the substrate is sandwiched between those side surfaces of the first bus bar and the second bus bar which are opposed to each other. The first magnetoelectric transducer is placed inside the first notch and fixed to the substrate.

8 Claims, 12 Drawing Sheets

(51) Int. Cl.
*G01R 15/20* (2006.01)
*H02M 1/00* (2006.01)

(56) References Cited

U.S. PATENT DOCUMENTS

2008/0094060 A1* 4/2008 Muraki ................ B82Y 25/00
    324/252
2014/0097826 A1* 4/2014 Hebiguchi ........... G01R 15/207
    324/117 R

FOREIGN PATENT DOCUMENTS

| WO | 2013/005459 A1 | 1/2013 |
| WO | 2015/082976 A1 | 6/2015 |

* cited by examiner

US 10,393,774 B2

BUS BAR MODULE

BACKGROUND OF THE INVENTION

1. Field of the Invention

The present invention relates to a bus bar module including a plurality of bus bars. Particularly, the present invention relates to a bus bar module including a current sensor.

2. Description of Related Art

An electrically-driven vehicle using a heavy-current uses a bus bar module in a power conversion apparatus for outputting electric power to a drive motor. The power conversion apparatus includes an inverter circuit for converting direct-current power of a battery into three-phase alternating current power. Since the power conversion apparatus of the electrically-driven vehicle uses a heavy-current, a bus bar module is used to transmit a three-phase output of the inverter circuit. The bus bar module for transmitting a three-phase output has three bus bars extending in parallel to each other.

The power conversion apparatus often includes a current sensor to monitor a three-phase output current. Since an output current is transmitted via a bus bar, the current sensor may be attached to the bus bar. A conventional typical current sensor is constituted by a C-shaped magnetic core surrounding a bus bar, and a magnetoelectric transducer placed in a gap of the magnetic core. The magnetic core gathers a magnetic flux generated around the bus bar due to a current flowing through the bus bar. The magnetic flux thus gathered by the magnetic core pass through the magnetoelectric transducer placed in the gap of the magnetic core. The magnetoelectric transducer detects a magnetic flux density of the magnetic flux to pass therethrough. Since a current has a unique relationship with a magnetic flux density, the detected magnetic flux density corresponds to a magnitude of the current flowing through the bus bar.

In recent years, the sensitivity of the magnetoelectric transducer has improved, and a current sensor including only a magnetoelectric transducer without a magnetic core has been developed. Such a current sensor is compact because the magnetic core is not provided therein. However, without the magnetic core, the sensitivity is often insufficient.

In view of this, a technique to increase sensitivity of a current sensor without a magnetic core has been proposed in International Publication WO2013/005459 and Japanese Patent Application Publication No. 2001-74783 (JP 2001-74783 A). The techniques of WO2013/005459 and JP 2001-74783 A are as follows. The techniques of WO2013/005459 and JP 2001-74783 A relate to a current sensor for measuring currents flowing through bus bars placed in parallel like the bus bar module. Each of the bus bars is provided with a crank-shaped folding portion, and a magnetoelectric transducer is placed in the folding portion. The folding portions of the bus bars in parallel to each other are provided at different positions in an extending direction of the bus bars. Accordingly, the magnetoelectric transducers are also placed at the different positions from each other in the extending direction. Since the positions of the magnetoelectric transducers are different in the extending direction of the bus bars, the crank-shaped folding portion of the bus bar does not affect the magnetoelectric transducers placed in the other bus bars. That is, the techniques of WO2013/005459 and JP 2001-74783 A prevent a SN ratio of a magnetoelectric transducer for measuring a magnetic field of a bus bar from decreasing under the influence of a crank-shaped folding portion of its adjacent bus bar.

Further, WO2013/005459 describes that magnetoelectric transducers to be placed in respective bus bars are attached to one substrate. Slits are provided in the substrate, so that the bus bars are put through the slits.

Further, in JP 2001-74783 A, the layout of a bus bar 11 is determined so that a magnetic flux generated from the bus bar 11 adjacent to a target bus bar 10 to be measured by a magnetoelectric transducer is parallel to a magnetic sensing surface of the magnetoelectric transducer. Accordingly, a magnetic flux density generated from the bus bar 11 is hard to penetrate through the magnetic sensing surface of the magnetoelectric transducer. This makes it possible to restrain the influence of the bus bar 11 with respect to the magnetoelectric transducer.

SUMMARY OF THE INVENTION

In a current sensor that does not have a magnetic core, if a magnetoelectric transducer is not provided in an exact position relative to a bus bar, accuracy of current measurement decreases. The present specification provides a bus bar module that improves a conventional technique, restrains the influence of a magnetic field generated from an adjacent bus bar, and increases accuracy of current measurement by accurately securing relative positions of a bus bar and a magnetoelectric transducer.

A bus bar module described in the present specification has the following configuration. The bus bar module includes a first bus bar, a second bus bar, a substrate, and a first magnetoelectric transducer. The first bus bar has a first notch. The second bus bar has a second notch, and the second bus bar is placed in parallel to the first bus bar. The second notch is provided at a position different from the first notch in an extending direction of the first bus bar. The substrate is fitted to both the first notch and the second notch. The substrate is sandwiched between the side surfaces of the first bus bar and the second bus bar which are opposed to each other. The first magnetoelectric transducer is placed inside the first notch and fixed to the substrate.

In the above bus bar module, the substrate secures accurate relative positions of the first bus bar and the second bus bar in terms of two directions. The two directions indicate an extending direction of the bus bars and an aligning direction of the bus bars. Here, the "extending direction" is a longitudinal direction of a bus bar, which is an elongated metal plate (bar), and indicates a direction where a current flows. Further, the "aligning direction" is a direction perpendicular to the extending direction, and indicates a direction where the first bus bar and the second bus bar are aligned. Further, by provided the magnetoelectric transducer in the substrate, accurate relative positions of the magnetoelectric transducer and the bus bar are secured. On that account, current measurement accuracy of the bus bar module is increased. Further, in the bus bar module, one substrate is assembled to a plurality of bus bars, so that relative positions of the plurality of bus bars to the magnetoelectric transducer are determined. Accordingly, with a simple assembly operation of the bus bar module, high relative position accuracy can be obtained.

Further, the notch reduces the sectional area of the bus bar. When the sectional area of the bus bar is reduced, a current density is increased. It is known that, when the current density is increased, a magnetic flux density caused around the bus bar due to the current is increased. In the above bus bar module, the first bus bar is configured such that a current path is narrowed by the first notch to increase the magnetic flux density, and the second bus bar adjacent thereto is configured such that the second notch is provided at a different position from the first notch in the extending direction. Hereby, the influence (that is, noise) of the magnetic flux generated from the second bus bar is restrained in the first bus bar.

High accuracy of positioning of the magnetoelectric transducer and the bus bar can be realized by portions other than the notch. For example, the high accuracy of the positioning can be realized by a crank-shaped bending portion. Another aspect of the bus bar module described in the present specification has the following structure. The bus bar module includes a first bus bar, a second bus bar, a substrate, a first magnetoelectric transducer, and a second magnetoelectric transducer. The first bus bar has a first bending portion having a crank-shape. The second bus bar has a second bending portion having a crank-shape, and the second bus bar is placed in parallel to the first bus bar. The second bending portion is provided at a position different from the first bending portion in an extending direction of the first bus bar. The substrate is fitted to both the first bending portion and the second bending portion. The substrate is sandwiched between the side surfaces of the first bus bar and the second bus bar which are opposed to each other. The first magnetoelectric transducer is placed inside the first bending portion and fixed to the substrate. The second magnetoelectric transducer is placed inside the second bending portion and fixed to the substrate. By including the bending portion, it is possible to obtain accurate relative positions of the plurality of bus bars and the magnetoelectric transducers by one substrate, similarly to the above bus bar module.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
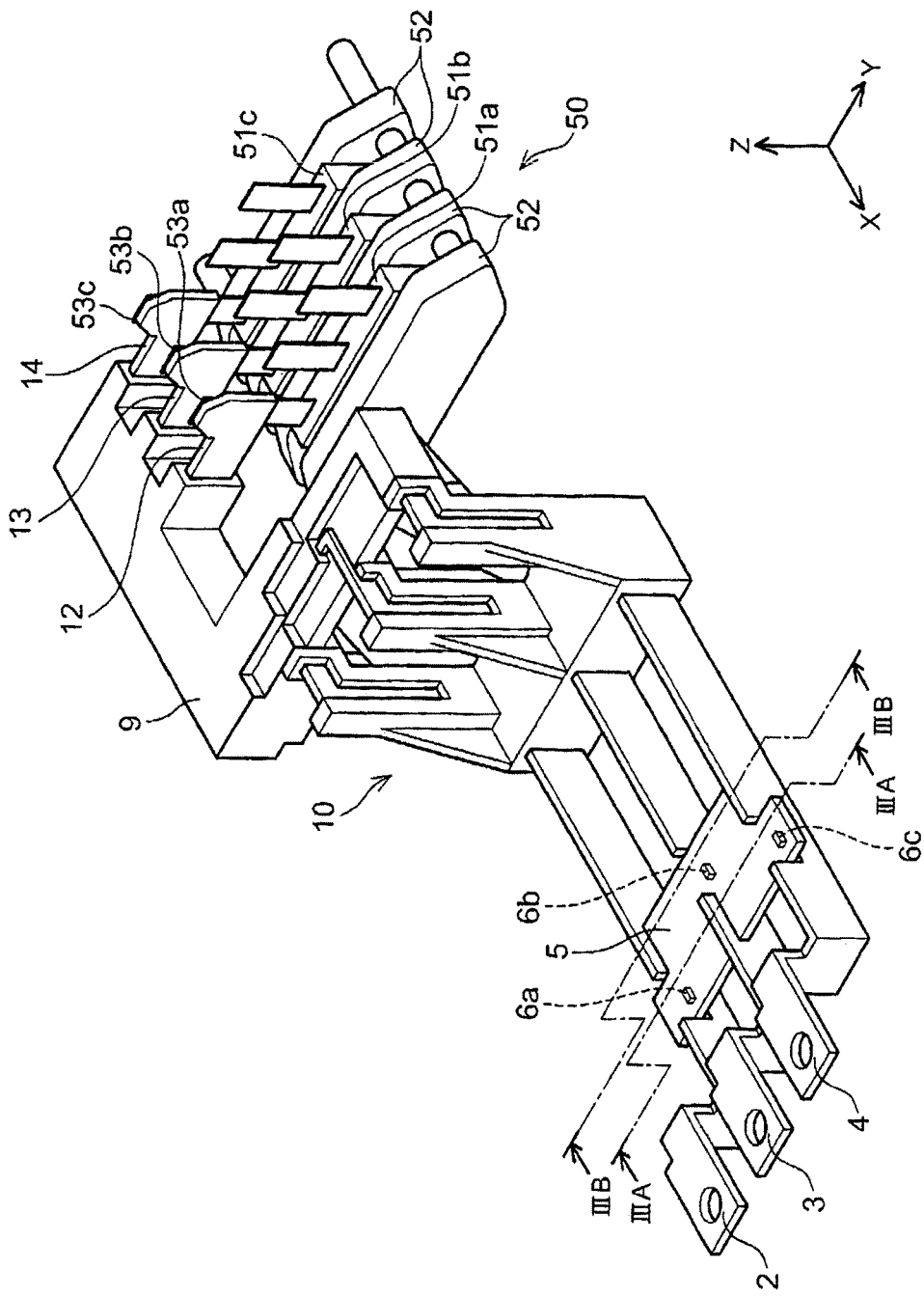
FIG. 1 is a perspective view of a bus bar module of an embodiment.

A first magnetoelectric transducer measures a magnetic flux (magnetic flux density) generated around a first bus bar due to a current flowing through the first bus bar. A magnitude of the magnetic flux density measured by the first magnetoelectric transducer uniquely corresponds to a magnitude of the current flowing through the first bus bar. Accordingly, the magnitude of the current flowing through the first bus bar is obtained from the magnetic flux density measured by the first magnetoelectric transducer. In order to simplify the description as follows, to obtain the magnitude of the current flowing through the first bus bar from the magnetic flux density measured by the first magnetoelectric transducer may be expressed as "the current of the first bus bar is measured by the first magnetoelectric transducer."

The magnetic flux density measured by the first magnetoelectric transducer includes a magnetic flux density caused due to a current flowing through a second bus bar. The magnetic flux density caused due to the current flowing through the second bus bar is noise for the first magnetoelectric transducer. Here, it is known that, when a current density is increased, a magnetic flux density is increased, in general. In a bus bar module described in the present specification, a sectional area of the first bus bar is smaller than a sectional area of the second bus bar in a section passing through the first magnetoelectric transducer and perpendicular to an extending direction. Accordingly, when it is assumed that currents of the same magnitude flow through the first bus bar and the second bus bar, a magnetic flux density caused due to the current of the first bus bar is relatively larger than a magnetic flux density caused due to the current of the second bus bar. Accordingly, in the magnetic flux density measured by the first magnetoelectric transducer, the influence of the magnetic flux density caused due to the current of the second bus bar is relatively decreased with respect to the magnetic flux density caused due to the current of the first bus bar. That is, in the bus bar module described in the present specification, the bus bars parallel to each other in a measurement point of the magnetic flux have different sectional areas, so as to increase a SN ratio (Signal Noise Ratio) of the first magnetoelectric transducer.

Note that, the bus bar module described in the present invention may include a magnetoelectric transducer (a second magnetoelectric transducer) for measuring the current of the second bus bar. In this case, the second magnetoelectric transducer is placed so as to be opposed to a side surface of the second bus bar in a position different from the first magnetoelectric transducer in the extending direction. In a second section passing through the second magnetoelectric transducer and perpendicular to the extending direction, a sectional area of the second bus bar may be smaller than a sectional area of the first bus bar. According to the above configuration, a SN ratio of the second magnetoelectric transducer is improved, similarly to the first magnetoelectric transducer.

In one aspect of the first and second bus bar, in the section passing through the first magnetoelectric transducer and perpendicular to the extending direction, the first magnetoelectric transducer may be placed on a straight line passing through a center of a section of the second bus bar and extending in an aligning direction of the first bus bar and the second bus bar. In this case, the first magnetoelectric transducer is placed so that a magnetic sensing surface thereof intersects with the straight line. Accordingly, the magnetic flux caused due to the current of the second bus bar is parallel to the magnetic sensing surface of the first magnetoelectric transducer. Hence, the influence given by the magnetic flux of the second bus bar to the first magnetoelectric transducer is reduced.

In further another aspect of the first and second bus bars, the bus bars have a flat section. Each of the first bus bar and the second bus bar includes a first side surface having a wide width and a second side surface having a width narrower than the first side surface. Here, the "width" indicates a length of the bus bar in a direction perpendicular to the extending direction. The first bus bar and the second bus bar are placed so that their respective first side surfaces are opposed to each other. In other words, the first magnetoelectric transducer is opposed to the first side surface of the second bus bar. As described above, the first magnetoelectric transducer is placed so that its magnetic sensing surface intersects with the straight line passing through the center of the section of the second bus bar and extending in the aligning direction of the first bus bar and the second bus bar. That is, the magnetic sensing surface of the first magnetoelectric transducer is parallel to the first side surface of the second bus bar. The magnetic flux (the magnetic flux generated from the second bus bar) caused due to the current of the second bus bar goes around the second bus bar. In a range of being opposed to a wider side surface (the first side surface) in the second bus bar, the magnetic flux is generally parallel to the side surface. Accordingly, the magnetic flux generated from the second bus bar is hard to penetrate through the magnetic sensing surface of the first magnetoelectric transducer. Further, since the magnetic field generated from the second bus bar is parallel to the first side surface of the second bus bar, even if the position of the first magnetoelectric transducer is misaligned toward a width direction of the first side surface of the second bus bar, the magnetic field generated from the second bus bar remains parallel to the magnetic sensing surface of the first magnetoelectric transducer. That is, even if the position of the first magnetoelectric transducer is misaligned in the width direction of the first side surface of the second bus bar, the influence given by the magnetic flux of the second bus bar to the first magnetoelectric transducer is hard to change. That is, the bus bar module is hard to be affected by disturbance in a case of misalignment. Further, it is possible to restrain the variation of current measurement accuracy with respect to the misalignment of the first magnetoelectric transducer.

Further, in a case where a notch is provided in the bus bar having a flat section, the notch may be provided on a narrower side surface (the second side surface) of the bus bar. In other words, the notch penetrating through a wide side surface (the first side surface) is provided. By providing the notch on the second side surface, it is possible to deepen the notch in comparison with a case where the notch is provided on the first side surface. Accordingly, a degree of freedom of the placement of the magnetoelectric transducer in the notch is increased.

Further, even in a case where sectional areas are the same and magnitudes of currents are the same, it is found that a current density becomes larger as an aspect ratio of the section is closer to 1.0. Accordingly, if the notch is provided on the narrower side surface of the bus bar, the aspect ratio of the section of the bus bar is decreased. In view of this, in a part where the notch is provided, a current density of the bus bar is further increased.

Figure 2:
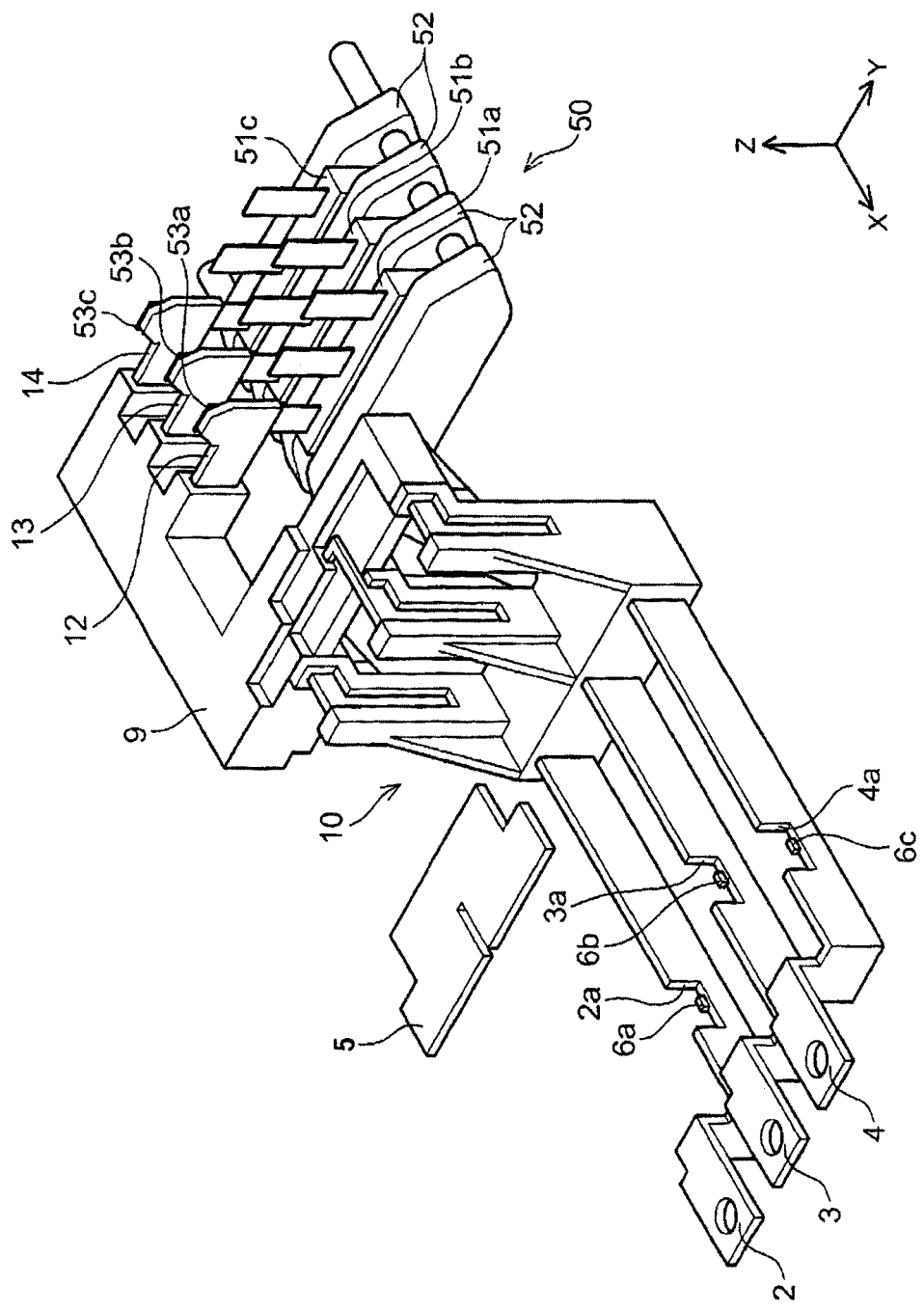
FIG. 2 is a perspective view of a bus bar module (a state where a substrate is removed)

A bus bar module according to an embodiment is described with reference to the drawings. FIGS. 1 and 2 illustrate a perspective view of a bus bar module 10. Note that FIG. 2 is a perspective view of the bus bar module in which a sensor substrate 5 is removed. Further, a laminated unit 50 connected to the bus bar module 10 is illustrated in FIGS. 1 and 2. It should be noted that, in FIGS. 1 and 2, the bus bar module 10 is illustrated in an enlarged manner as compared with the laminated unit 50.

First described is an outline of the laminated unit 50. The laminated unit 50 is a main part of an inverter for supplying electric power to a drive motor of an electrically-driven vehicle. The laminated unit 50 is a device in which flat-plate power cards 51a to 51c each formed by sealing power semiconductor elements with resin and flat-plate coolers 52 are laminated alternately. In each of the power cards, a series circuit of two power semiconductor elements is embedded. The power semiconductor element is typically an IGBT (Insulated Gate Bipolar Transistor). An alternating current to be supplied to a motor is output from a middle of the series circuit. Terminals 53a to 53c are respective output terminals of three power cards 51a to 51c. The terminals 53a to 53c output a U-phase alternating current, a V-phase alternating current, and a W-phase alternating current, respectively. The drive motor of the electrically-driven vehicle has a large output, so that heavy-currents are output from the terminals 53a to 53c. In order to transmit the heavy-currents from the power cards to the motor, the bus bar module 10 with a small internal resistance is used. Generally, the bus bar is made of an elongated metal plate (or metal rod).

The bus bar module 10 is an electrically-conductive component for transmitting alternating current outputs of three phases of UVW of the laminated unit 50 to an external terminal (not shown) of an inverter housing. The bus bar module 10 has three bus bars 2, 3, 4 for outputting alternating currents of three phases of UVW. The three bus bars 2, 3, 4 are collectively held in a resin holder 9 so as to be parallel to each other. One end 12 of the bus bar 2 is connected to the terminal 53a of the power card 51a, one end 13 of the bus bar 3 is connected to the terminal 53b of the power card 51b, and one end 14 of the bus bar 4 is connected to the terminal 53c of the power card 51c. The other ends of the three bus bars are connected to a terminal block (not shown) provided in a casing of the inverter. The three bus bars 2 to 4 extending in parallel are bent several times so to detour around other devices (not shown).

The inverter often includes a current sensor for measuring an output current so as to perform a feedback control of the output current. The current sensor is incorporated in the bus bar module 10. Major components of the current sensor are magnetoelectric transducers 6a to 6c. The magnetoelectric transducer measures a magnetic field (magnetic flux density) generated around a bus bar caused due to a current flowing through the bus bar. Note that, in the following description, when the magnetoelectric transducers 6a to 6c are shown without distinction, they are expressed as the "magnetoelectric transducer 6." As illustrated in FIGS. 1, 2, the magnetoelectric transducer 6 is a coreless sensor without any magnetic cores.

Sensor signals of the magnetoelectric transducers 6a to 6c are converted to have a magnitude of a current by a signal processing chip (not shown) mounted on the sensor substrate 5. The current thus measured is transmitted to a controller (not shown). The magnetoelectric transducer 6a provided so as to be opposed to the bus bar 2 detects a magnetic flux caused due to a current flowing through the bus bar 2. The magnetoelectric transducer 6b provided so as to be opposed to the bus bar 3 detects a magnetic flux caused due to a current flowing through the bus bar 3. The magnetoelectric transducer 6c provided so as to be opposed to the bus bar 4 detects a magnetic flux caused due to a current flowing through the bus bar 4. The magnetoelectric transducers 6 provided in respective bus bars and the sensor substrate correspond to the current sensor.

FIG. 2 is a perspective view of the bus bar module 10 in which the sensor substrate 5 is removed. Although the magnetoelectric transducers 6 are attached to a bottom face of the sensor substrate 5, the magnetoelectric transducers 6 are described separately from the sensor substrate 5 in FIG. 2. Positions of the magnetoelectric transducers 6 in FIG. 2 are positions when the sensor substrate 5 is attached to the bus bars 2 to 4. Note that, in FIG. 1, the magnetoelectric transducers 6 are described by a hidden line (a broken line).

As illustrated well in FIGS. 1, 2, the bus bars 2 to 4 are provided with notches 2a to 4a, respectively, and the magnetoelectric transducers 6 are placed inside the notches 2a to 4a. The notch is provided on a narrower side surface of the bus bar having a rectangular section. When expressed from another viewpoint, the notch is provided so as to penetrate through a wider side surface of the bus bar. Further, the notches 2a to 4a are provided on side surfaces of the bus bars on the same side. Furthermore, notches of adjacent bus bars are provided at different positions in an extending direction (an X-axis direction in the figure). It can be said that the bus bars 2 to 4 have flat sections.

Note that to be "flat" herein includes not only a rectangular shape, but also an elliptical shape, and a shape partially including a projection. Further, that a magnetoelectric transducer is placed inside a notch indicates that a space defined by the notch (a space surrounded by both sides surfaces and a bottom face of the notch) should include at least part of the magnetoelectric transducer, and the magnetoelectric transducer may not be entirely included in the space defined by the notch. Further, that notches of adjacent bus bars are provided at different positions in the extending direction indicates that the notches of the adjacent bus bars are provided at positions that do not overlap with each other in a direction perpendicular to the extending direction. In this case, the notches may partially overlap with each other. However, a magnetoelectric transducer placed inside a notch of one bus bar does not overlap with a notch of the other bus bar in the direction perpendicular to the extending direction.

The following describes the sensor substrate 5 that fixes three magnetoelectric transducers 6. The sensor substrate 5 is placed so that its flat surface is parallel to the plurality of bus bars 2 to 4. Further, the sensor substrate 5 is fitted to the notches 2a to 4a of three bus bars 2 to 4. An end of the sensor substrate 5 abuts with opposed side surfaces of respective notches. Accordingly, the sensor substrate 5 is fitted to the notches, so that relative positions of the plurality of bus bars in a bus-bar longitudinal direction (the X-axis direction in the figure) are maintained. Further, the sensor substrate 5 is sandwiched between facing surfaces of adjacent bus bars. For example, part of the sensor substrate 5 is sandwiched between the bus bar 2 and the bus bar 3 adjacent to each other. Further, another part of the sensor substrate 5 is sandwiched between the bus bar 3 and the bus bar 4 adjacent to each other. Since the sensor substrate 5 abuts with side surfaces of respective bus bars, an interval between adjacent bus bars is maintained. As such, the sensor substrate 5 supports the magnetoelectric transducers 6, and further functions to maintain relative positions of three bus bars 2 to 4. Accordingly, the sensor substrate 5 maintains relative positions of the plurality of bus bars parallel to each other and the magnetoelectric transducers 6 opposed to respective bus bars, thereby reducing variation in current measurement accuracy (magnetic flux detection accuracy) at the time of mass production of the bus bar module.

A magnetic flux detected by the magnetoelectric transducer 6a includes a magnetic flux generated from its adjacent bus bar 3. Similarly, a magnetic flux detected by the magnetoelectric transducer 6b includes magnetic fluxes generated from its adjacent bus bar 2 and bus bar 4. A magnetic flux generated from a bus bar adjacent to a target bus bar for detection corresponds to noise. The bus bar module 10 has a structure that restrains influence of noise generated from an adjacent bus bar. Next will be described the structure to restrain noise.

Figure 3A:
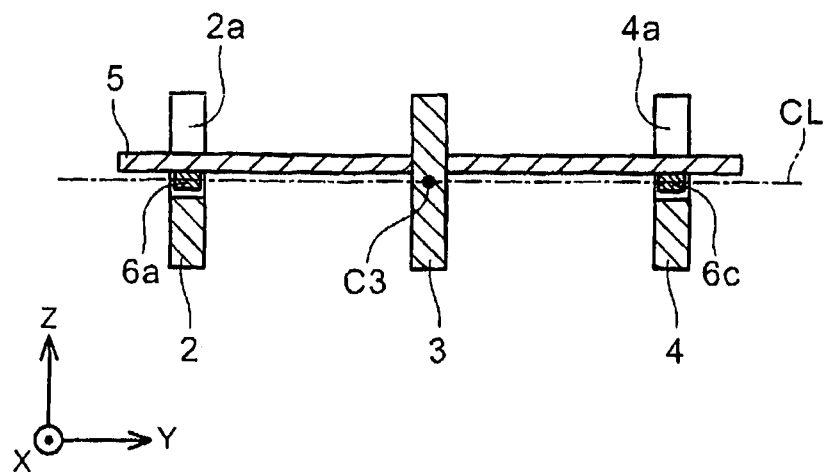
FIG. 3A is a sectional view of a bus bar module taken along a line IIIA-IIIA in FIG. 1.
Figure 3B:
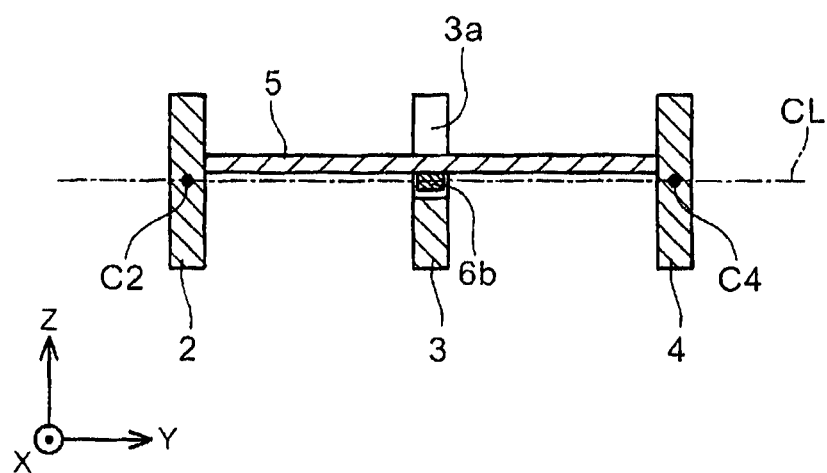
FIG. 3B is a sectional view of the bus bar module taken along a line IIIB-IIIB in FIG. 1.

FIG. 3A illustrates a section taken along a line IIIA-IIIA in FIG. 1. Further, FIG. 3B illustrates a section taken along a line IIIB-IIIB in FIG. 1. FIG. 3A illustrates a section passing through the magnetoelectric transducers 6a and 6c and perpendicular to the extending direction of the bus bars (the X-axis direction in the figure). Hereinafter, the extending direction of the bus bars may be just referred to as the "extending direction." FIG. 3B illustrates a section passing through the magnetoelectric transducer 6b and perpendicular to the extending direction.

Here, the bus bar 2 and the bus bar 3 adjacent to each other are dealt with particularly. In the section of FIG. 3A, the magnetoelectric transducer 6a for detecting a magnetic flux caused due to a current flowing through the bus bar 2 is placed so as to be opposed to a bottom face of the notch 2a of the bus bar 2. Further, in the section of FIG. 3A, a sectional area of the bus bar 2 is reduced by the notch 2a, and is smaller than a sectional area of the bus bar 3. Further, in the section of FIG. 3B, the magnetoelectric transducer 6b for detecting a magnetic flux caused due to a current flowing through the bus bar 3 is placed so as to be opposed to a bottom face of the notch 3a of the bus bar 3. Further, in the section of FIG. 3B, a sectional area of the bus bar 3 provided with the magnetoelectric transducer 6b is reduced by the notch 3a, and is smaller than a sectional area of the bus bar 2. That is, in the bus bar module 10, a first magnetoelectric transducer (e.g., the magnetoelectric transducer 6a) is placed so as to be opposed to a side surface of a first bus bar (e.g., a bus bar 2). A sectional area of the first bus bar (the bus bar 2) in a first section (the section of FIG. 3A) passing through the first magnetoelectric transducer (the magnetoelectric transducer 6a) and perpendicular to the extending direction is smaller than a sectional area of a second bus bar (the bus bar 3). A second magnetoelectric transducer (e.g., the magnetoelectric transducer 6b) is placed so as to be opposed to a side surface of the second bus bar (e.g., the bus bar 3). A sectional area of the second bus bar (the bus bar 3) in a second section (the section of FIG. 3B) passing through the second magnetoelectric transducer (the magnetoelectric transducer 6b) and perpendicular to the extending direction is smaller than the sectional area of the first bus bar (the bus bar 2). Note that, in parts except the notch, the sectional area of the bus bar 2 is the same as the sectional area of the bus bar 3. The same can be true to the bus bar 3 and the bus bar 4 adjacent to each other.

The following describes an effect of the difference in sectional area. Generally, as a current density is higher, a magnetic flux density caused due to the current becomes higher. For example, in a case where a current of the same magnitude flows, when a sectional area of a current path is smaller and a current density is higher, a magnetic flux density caused due to the current becomes higher. In the bus bar module 10 of the embodiment, in the section (FIG. 3A) passing through the magnetoelectric transducer 6a for detecting a magnetic flux (a current) of the bus bar 2, the sectional area of the bus bar 2 is smaller than the sectional area of its adjacent bus bar 3. In a case where currents of the same magnitude flow through the bus bar 2 and the bus bar 3, a magnetic flux density generated around the bus bar 2 is higher than a magnetic flux density generated around the bus bar 3 in the section passing through the magnetoelectric transducer 6a. Accordingly, sensitivity of the magnetoelectric transducer 6a with respect to the magnetic flux caused due to the current flowing through the bus bar 2 becomes relatively high, and sensitivity thereof with respect to the magnetic flux caused due to the current flowing through the bus bar 3 becomes relatively low. The magnetoelectric transducer 6a detects the magnetic flux caused due to the current flowing through the bus bar 2. The magnetic flux density caused due to the current flowing through the bus bar 3 corresponds to noise for the magnetoelectric transducer 6a. Accordingly, with the above configuration, a SN ratio (Signal Noise Ratio) of the magnetoelectric transducer 6a is increased. The same can be true to the other magnetoelectric transducers 6b, 6c.

Further, in FIG. 3A, a broken line CL indicates a center line passing through a sectional center C3 of the bus bar 3 and extending in an aligning direction of the bus bars. The magnetoelectric transducer 6a opposed to the bus bar 2 and the magnetoelectric transducer 6c opposed to the bus bar 4 both pass through the center line CL. Similarly, as illustrated in FIG. 3B, the magnetoelectric transducer 6b placed so as to be opposed to the bus bar 3 passes through a center line CL passing through a sectional center C2 of the bus bar 2 and a sectional center C4 of the bus bar 4 and extending in the aligning direction. Note that a sectional center is equivalent to a center of a current density, in a section of a bus bar, of a current flowing through the bus bar. Here, the center of the current density is a virtual current path with an infinite current density, represented by a point in the section of the bus bar. The virtual current path forms an induction field that is the same as an induction field formed by a current distributed over the section of the bus bar. For example, if the first section has a rectangular shape, a center of a current density indicates a centroid of the rectangular shape. In a case where a projection is provided in the rectangular shape of the section, the center of the current density moves to a direction where the projection projects.

Figure 4:
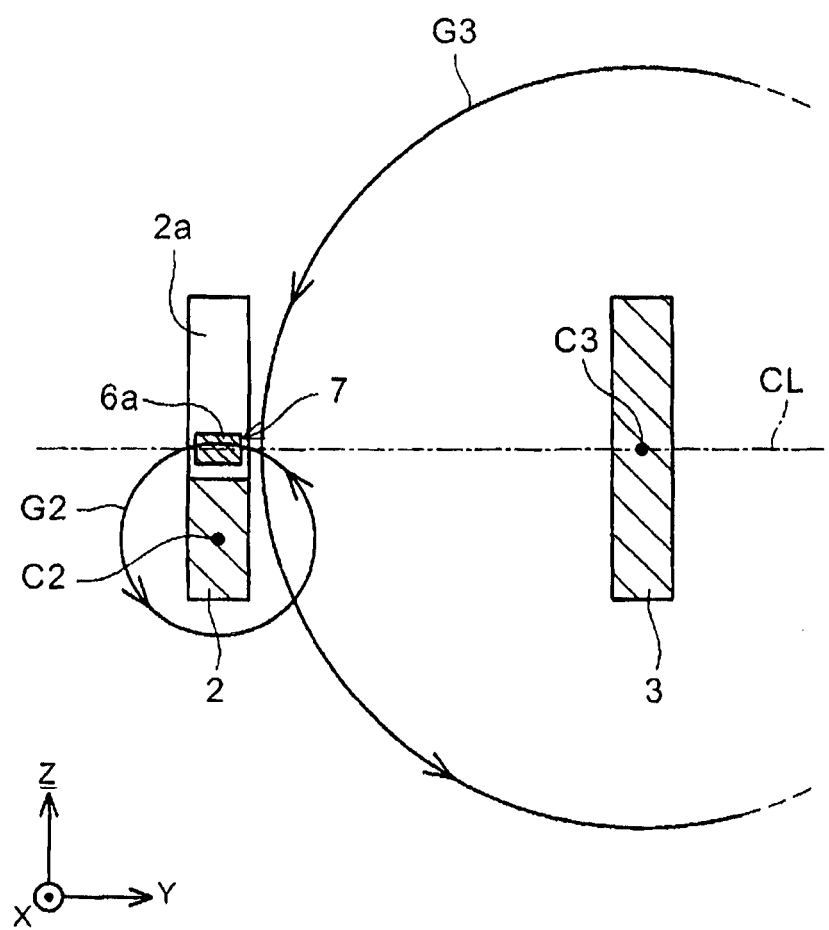
FIG. 4 is a view illustrating a relationship between a magnetic flux density generated around a bus bar and a magnetoelectric transducer.

Advantages of the above layout are described below with reference to FIG. 4. FIG. 4 illustrates the sections of the bus bar 2 and the bus bar 3 in FIG. 3A in an enlarged manner. As described above, the magnetoelectric transducer 6a for detecting a magnetic flux density caused due to a current flowing through the bus bar 2 is placed on the center line CL passing through the sectional center C3 of the adjacent bus bar 3 and extending in the aligning direction of the plurality of bus bars. Generally, in a magnetoelectric transducer, a surface for detecting a magnetic flux, that is, a magnetic sensing surface is determined, and a reference sign 7 indicates the magnetic sensing surface in FIG. 4. When the magnetic sensing surface 7 is perpendicular to the magnetic flux, the sensitivity of magnetic flux detection is highest. As illustrated in FIG. 4, the magnetic sensing surface 7 is perpendicular to a magnetic flux G2 caused due to the current flowing through the bus bar 2, but is parallel to a magnetic flux G3 caused due to the current flowing through the bus bar 3. In other words, the magnetic flux G2 caused due to the current flowing through the bus bar 2 perpendicularly intersects with the magnetic sensing surface 7, but the magnetic flux G3 caused due to the current flowing through the bus bar 3 hardly intersects with the magnetic sensing surface 7. Hence, the magnetoelectric transducer 6a has high sensitivity to the magnetic flux generated by the bus bar 2, and has low sensitivity to the magnetic flux generated by the bus bar 3. That is, an SN ratio of the magnetoelectric transducer 6a is high. Note that it is assumed that the current flows from a far side on a plane of paper toward a near side in the section of the bus bar 2 (the bus bar 3). Further, in a case where a magnetic flux caused due to a current is considered, a current may be supposed to flow through a sectional center of a bus bar concentratedly. That is, a curved line indicative of the magnetic flux G2 corresponds to a circle around the sectional center C2 of the bus bar 2, and a curved line indicative of the magnetic flux G3 corresponds to a circle around the sectional center C3 of the bus bar 3. The same can be true to the other magnetoelectric transducers 6b, 6c.

The above layout can be expressed as follows. That is, the magnetoelectric transducer 6a opposed to the bus bar 2 is placed so that its magnetic sensing surface 7 is perpendicular to the straight line CL passing through the sectional center C3 of the adjacent bus bar 3 and the magnetoelectric transducer 6a.

In the bus bar module 10 described in FIGS. 1 to 4, the section of each bus bar is rectangular (flat), and the plurality of bus bars is placed so that their respective wide side surfaces are opposed to each other. The following describes bus bar modules in which a shape of a bus bar is different from that of the bus bars 2 to 4 described in FIGS. 1 to 4. That is, modifications of the bus bar module 10 are described. Note that, in the following description, only the shape of the bus bar is different from the above, so that a substrate and a whole bus bar module are omitted. Further, the number of bus bars described in the present specification is not limited in particularly provided that the number of bus bars is at least two, but the following description focuses on two bus bars.

Figure 5:
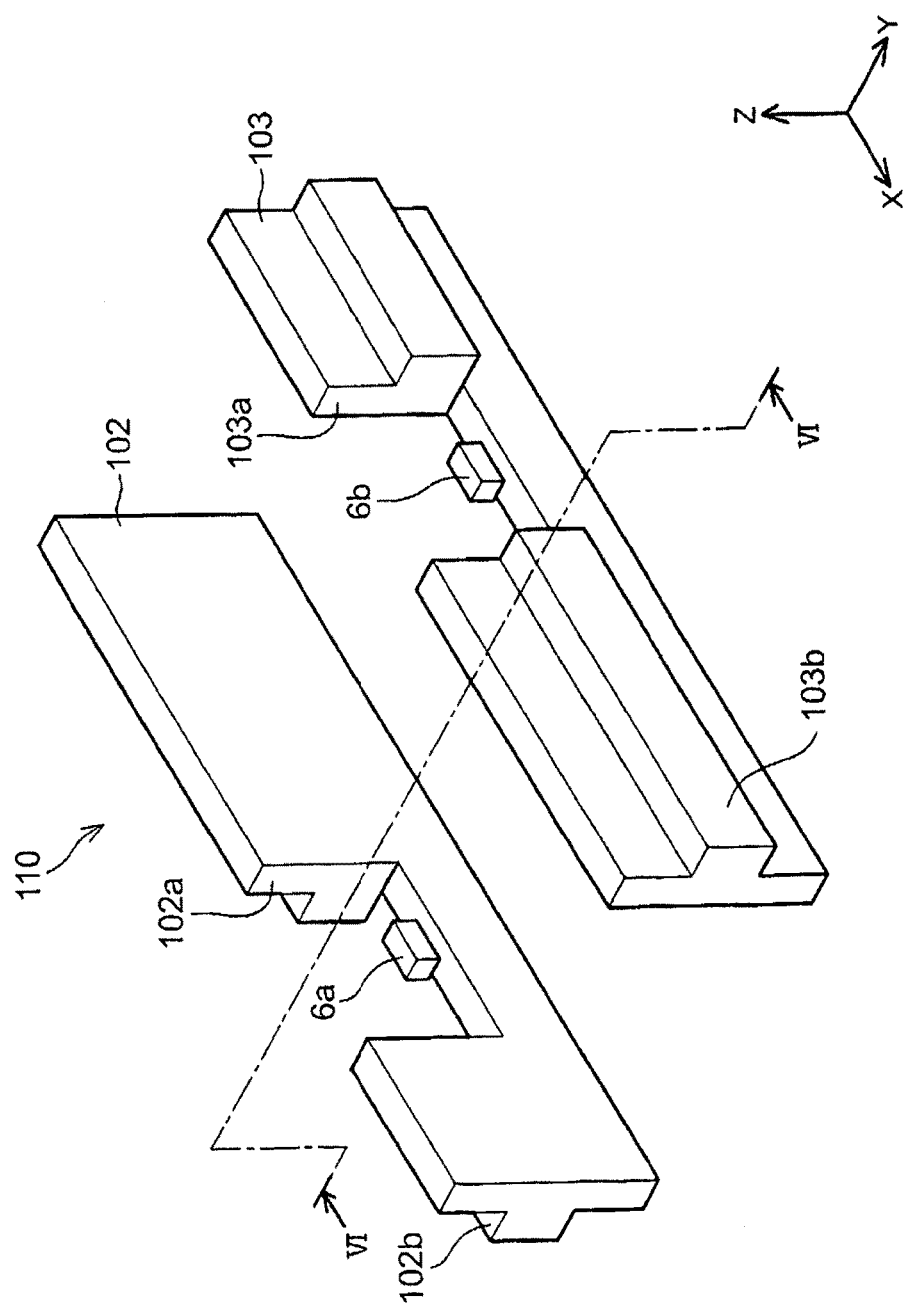
FIG. 5 is a perspective view of a bus bar (bus bar module) of a first modification.

FIG. 5 is a perspective view of a bus bar module 110 having bus bars 102, 103 according to a first modification. Note that, as described above, a sensor substrate and a whole bus bar module are omitted. FIG. 5 illustrates only a peripheral area around magnetoelectric transducers 6a, 6b, and only some parts of the bus bars 102, 103 are illustrated. The same can be true to the drawings referred to in the following description.

The bus bar 102 and the bus bar 103 have a flat section, and are placed so that their respective wide side surface are opposed to each other. The bus bar 102 and the bus bar 103 are provided with notches 102a, 103a at different positions in their extending direction. Magnetoelectric transducers 6a, 6b are placed inside respective notches. The configuration described so far is the same as that of the bus bar module 10 of FIG. 1.

The bus bar 102 has, on its wide side surface, a ridge 102b extending in the extending direction. Similarly, the bus bar 103 has, on its wide side surface, a ridge 103b extending in the extending direction. As described above, the "extending direction" indicates a longitudinal direction of the bus bar, and corresponds to the X-axis direction in the figure. The ridge 103b of the bus bar 103 is provided on a side surface distanced from its adjacent bus bar 2.

Figure 6:
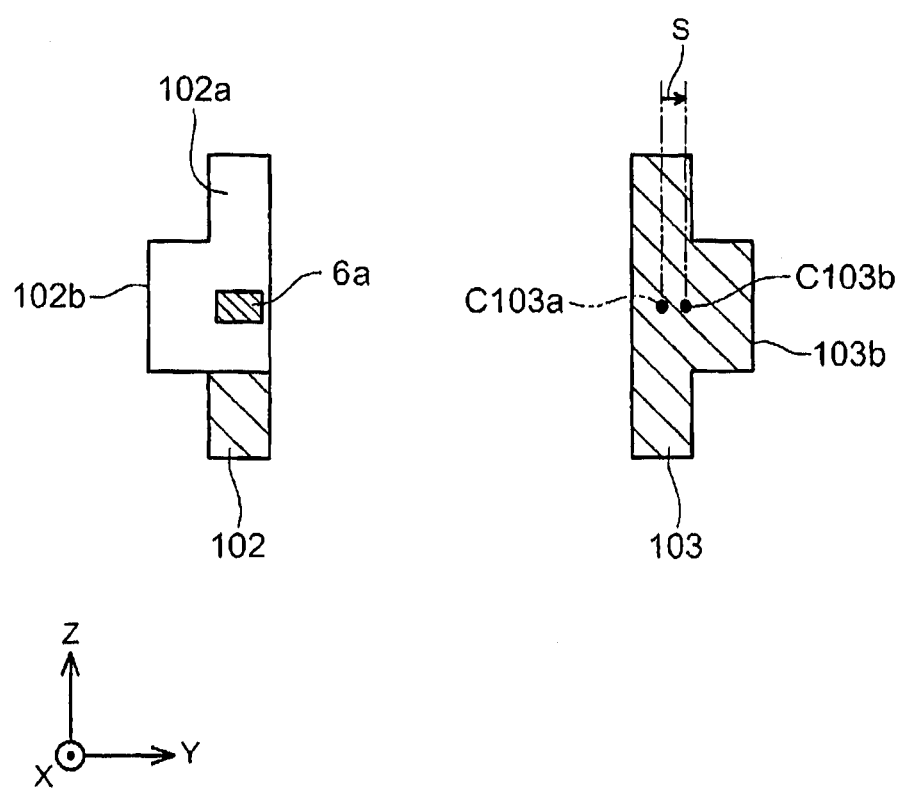
FIG. 6 is a sectional view of the bus bar (bus bar module) of the first modification.

An advantage of the ridges 102b, 103b is described below. FIG. 6 is a sectional view taken along a line IV-IV in FIG. 5. A section of FIG. 6 is a section passing through the magnetoelectric transducer 6a of the bus bar 102 and perpendicular to the extending direction. As illustrated well in FIG. 6, the bus bar 102 and the bus bar 103 are provided so that their wider side surfaces (first side surfaces) among side surfaces of the bus bars are opposed to each other. The ridge 103b of the bus bar 103 is provided on the side surface distanced from the bus bar 2. As illustrated in FIG. 6, a sectional center C103b of the bus bar 3 is separated from the magnetoelectric transducer 6a for detecting a magnetic flux caused due to a current flowing through the adjacent bus bar 2, by a distance S between the sectional center C103b and a section center C103a of a case where the ridge 103b is not provided. The sectional center C103b of the bus bar 3 corresponds to a center of a current density. That is, since the ridge 103b is provided, the center of the current flowing through the bus bar 103 is separated from the magnetoelectric transducer 6a. As a result, the influence given by the magnetic flux caused due to the current flowing through the bus bar 3 to a measured magnetic flux density (a measured current) of the magnetoelectric transducer 6a becomes small. The shape of the bus bar illustrated in FIGS. 5 and 6 further increases an SN ratio of current measurement (a detected SN ratio of the magnetic flux caused due to the current).

The ridge 102b of the bus bar 102 is provided on a side surface distanced from its adjacent bus bar 103. Accordingly, similarly to the ridge 103b of the bus bar 103, that influence of a magnetic field generated from the bus bar 102 which is given to the magnetoelectric transducer 6b is reduced by providing the ridge 102b. The magnetoelectric transducer 6b is an element for detecting a current (magnetic flux) of the adjacent bus bar 103.

Figure 7:
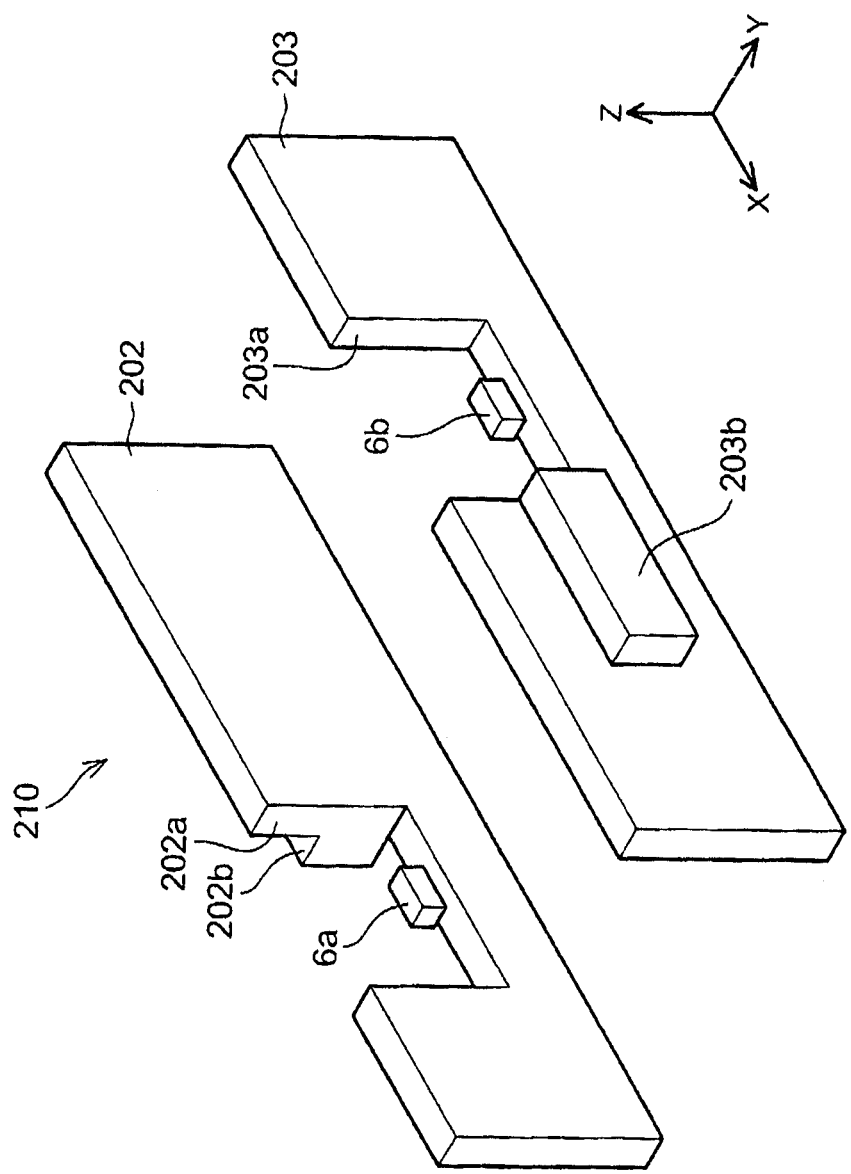
FIG. 7 is a perspective view of a bus bar (bus bar module) of a second modification.

Even when a projection is provided instead of the ridge 102b, 103b, the same effect can be obtained. FIG. 7 illustrates part of a bus bar module 210 including projections 202b, 203b provided on respective side surfaces of bus bars 202, 203. The bus bar 202 is provided with a notch 202a, and a magnetoelectric transducer 6a for detecting a magnetic flux caused due to a current flowing through the bus bar 202 is placed in the notch 202a. In a section passing through the magnetoelectric transducer 6a, the bus bar 203 adjacent thereto includes the projection 203b provided on its side surface separated from the magnetoelectric transducer 6a. In the bus bar module 210, a shape of the section passing through the magnetoelectric transducer 6a is the same as that in FIG. 6. Accordingly, the same effect as the bus bar module 110 can be obtained from the bus bar module 210. The same effect can be also obtained from the projection 202b provided in the bus bar 202.

Figure 8:
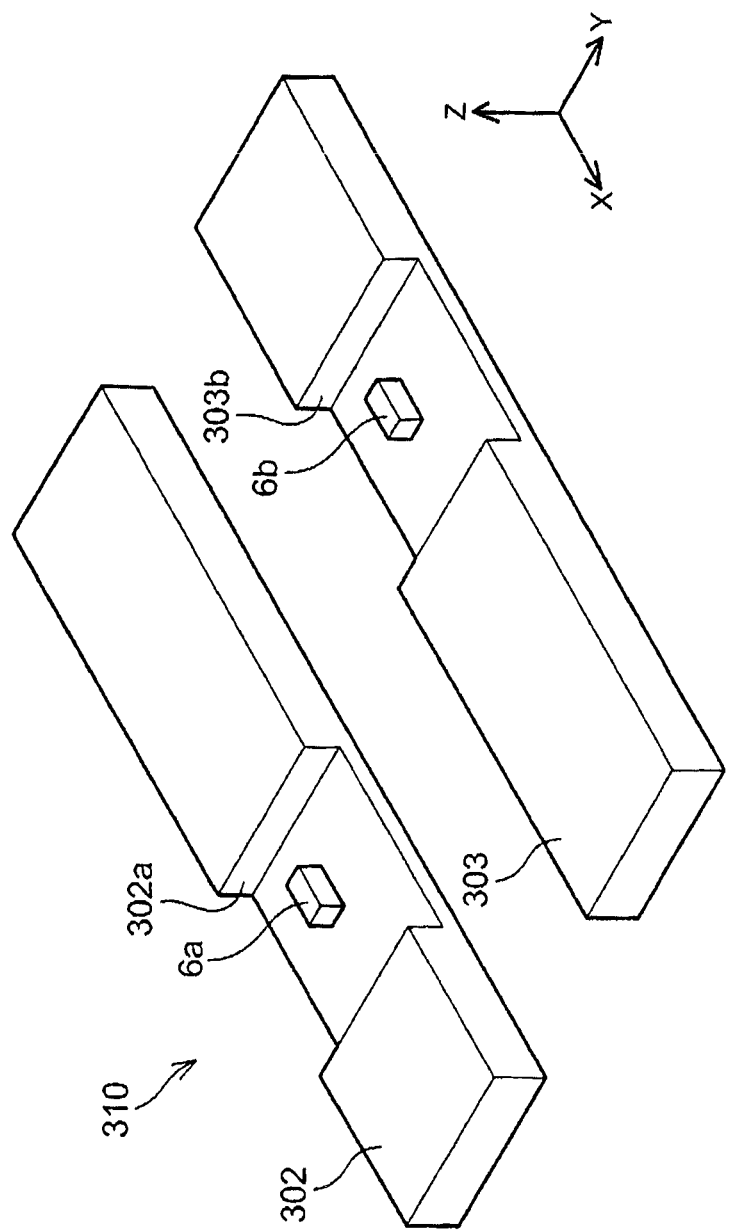
FIG. 8 is a perspective view of a bus bar (bus bar module) of a third modification.

In the bus bar modules described above, a plurality of bus bars is provided so that their respective wider side surfaces (the first side surfaces) among the side surfaces of the bus bars are opposed to each other. In the technique described in the present specification, the plurality of bus bars may be placed so that their respective narrower side surfaces (the second side surfaces) among the side surfaces of the bus bars are opposed to each other. FIG. 8 illustrates part of a bus bar module 310 of a third modification. FIG. 8 is a perspective view illustrating the placement of two bus bars 302, 303 adjacent to each other in the bus bar module 310. The bus bars 302 and 303 are placed in parallel to each other so that their respective narrow side surfaces are opposed to each other. The bus bars 302, 303 include notches 302a, 303a provided on their wide side surfaces. The notches 302a, 303a are provided at different positions in an extending direction of the bus bars (the X-axis direction in the figure). Magnetoelectric transducers 6a, 6b are placed inside respective notches. The magnetoelectric transducers 6a, 6b are placed so as to be opposed to bottom faces of the respective notches. Each of the magnetoelectric transducers 6a, 6b detects a magnetic field (magnetic flux density) caused due to a current flowing through each of the bus bars. Since the magnetic field has a unique relationship with the flowing current, a magnitude of the current flowing through the each of the bus bars can be specified from the magnetic flux density detected by the each of the magnetoelectric transducers 6a, 6b.

The bus bar module 10 illustrated in FIGS. 1 to 4 is different from the bus bar module 310 in FIG. 8 in a posture of the bus bars when viewed from the extending direction. The technique described in the present specification provides the bus bar module 10 and the bus bar module 310, but the bus bar module 10 has a higher SN ratio of current measurement than that of the bus bar module 310. The reason is as follows.

Figure 9A:
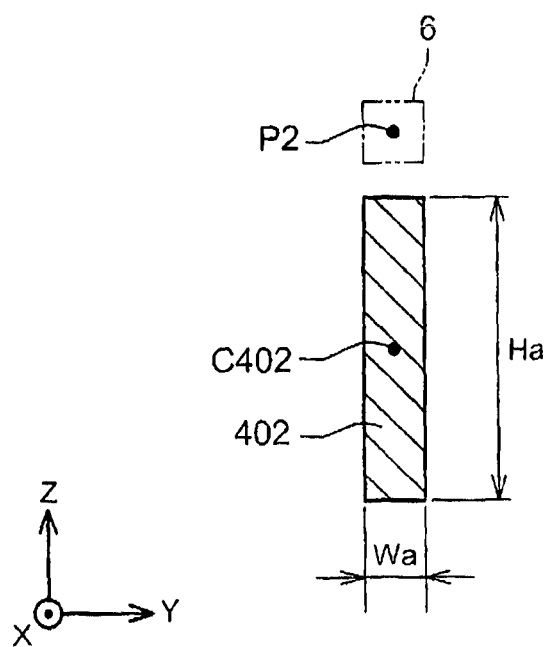
FIG. 9A is a sectional view of a magnetoelectric transducer when the magnetoelectric transducer is placed so as to be opposed to a narrow side surface of a bus bar.
Figure 9B:
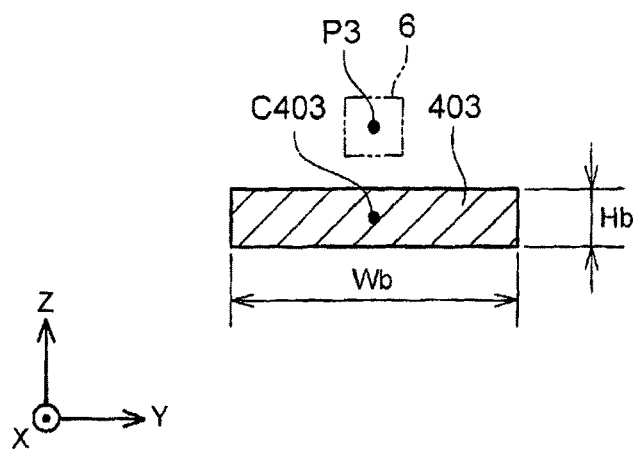
FIG. 9B is a sectional view of a magnetoelectric transducer when the magnetoelectric transducer is placed so as to be opposed to a wide side surface of the bus bar.

FIG. 9A is a sectional view of a magnetoelectric transducer 6 when the magnetoelectric transducer 6 is placed so as to be opposed to a narrow side surface of a bus bar 402; and FIG. 9B is a sectional view of a magnetoelectric transducer 6 when the magnetoelectric transducer 6 is placed so as to be opposed to a wide side surface of a bus bar 403. In a case of FIG. 9A, a ratio of a width Wa of a side surface (a narrow side surface) opposed to the magnetoelectric transducer 6 to a width Ha of a side surface (a wide side surface) intersecting with the above side surface is Wa/Ha=1/10. In a case of FIG. 9B, a ratio of a width Wb of a side surface (a wide side surface) opposed to the magnetoelectric transducer 6 to a width Hb of a side surface (a narrow side surface) intersecting with the above side surface is Wb/Hb=10/1. That is, the bus bar 403 corresponds to one obtained by rotating the bus bar 402 by 90 degrees when viewed from its extending direction. About each of the case of FIG. 9A and the case of FIG. 9B, a strength of a magnetic flux density in a central position of the magnetoelectric transducer 6 (a point P2 for FIG. 9A, and a point P3 for FIG. 9B) was obtained by simulation.

Figure 10:
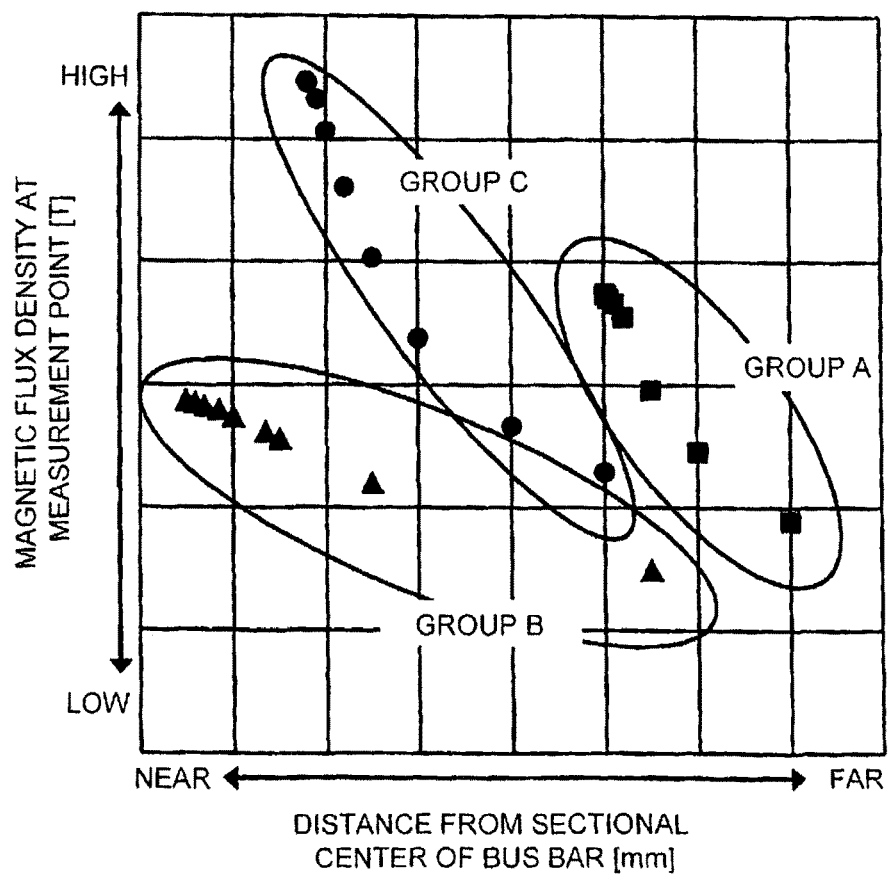
FIG. 10 is graphs of simulations of magnetic flux densities at respective positions of the magnetoelectric transducers in the case of FIG. 9A and in the case of FIG. 9B.

The results of the simulation are shown in FIG. 10. Sectional areas of the bus bars in the case of FIG. 9A and in the case of FIG. 9B are the same. Further, the simulation was performed by applying the same current in the case of FIG. 9A and in the case of FIG. 9B. Group A (a square plot group) is a result of the case of FIG. 9A, and Group B (a triangular plot group) is a result of the case of FIG. 9B. Note that Group C (a circular plot group) shows a result of a case where a sectional area is the same and an aspect ratio is 1.0, namely, a section has a square shape. The groups exhibit results obtained by performing the simulation by changing a distance L from a sectional center of a bus bar to a magnetic flux detection point. In the case of FIG. 9A, the distance L is a distance from a sectional center C402 of the bus bar to a magnetic flux detection point P2, and in the case of FIG. 9B, the distance L is a distance from a sectional center C403 of the bus bar to a magnetic flux detection point P3. Basically, the distance L in the case of FIG. 9A is longer than the distance L in the case of FIG. 9B. As shown in the graph of FIG. 10, it is understood that the magnetic flux density at a point where the magnetoelectric transducer is placed is higher in Group A (a case where the magnetoelectric transducer is placed so as to be opposed to the narrow side surface of the bus bar) than Group B (a case where the magnetoelectric transducer is placed so as to be opposed to the wide side surface of the bus bar). From this result, it is understood that an SN ratio of current measurement can be increased in the case where a notch is provided on a narrow side surface of a bus bar and a magnetoelectric transducer is placed in the notch, as compared with the case where a notch is provided on a wide side surface of a bus bar and a magnetoelectric transducer is placed in the notch.

Further, the magnetic flux density generated around the bas bar becomes higher as the aspect ratio of the section is closer to 1.0 (see the result of Group C in FIG. 10). When a notch is provided on a narrow side surface of a flat section, an aspect ratio of a sectional shape of the other part of the bus bar becomes closer to 1.0. This point also contributes to an increase in the SN ratio of current measurement.

Furthermore, the wide side surfaces of the bus bars are opposed to each other and the notches are provided on the narrow side surfaces thereof, which yields the following effect. As illustrated well in FIG. 4, the magnetoelectric transducer 6a for detecting a magnetic flux caused due to a current flowing through the bus bar 2 has a positional relationship in which the magnetoelectric transducer 6a is opposed to the wide side surface of the bus bar 3 adjacent to the bus bar 2 as a current measurement target (a magnetic flux detection target). As described above, when the magnetoelectric transducer is placed so as to be opposed to the wide side surface (Group B in FIG. 10), a magnetic flux density detected by the magnetoelectric transducer becomes small in comparison with the case where the magnetoelectric transducer is placed so as to be opposed to the narrow side surface (Group A of FIG. 10). At a position of the magnetoelectric transducer 6a, a magnetic field caused due to a current flowing through the bus bar 3 is parallel to the magnetic sensing surface 7 of the magnetoelectric transducer 6a. In the meantime, a magnetic flux caused due to the current of the adjacent bus bar 3 (a magnetic flux generated from the current flowing through the bus bar 3) goes around the bus bar 2 as the current measurement target (the magnetic flux detection target), but the magnetic flux is generally parallel to the wide side surface in a range where the magnetic flux is opposed to the wide side surface. Accordingly, the magnetic flux generated from the bus bar 3 does not penetrate through the magnetic sensing surface 7 of the magnetoelectric transducer 6a. Further, since the magnetic field generated from the bus bar 3 is parallel to the wide side surface of the bus bar 3, even if the position of the magnetoelectric transducer 6a is misaligned in a width direction of the wide side surface of the bus bar 2 (positive and negative Z-axis directions in FIG. 4), the magnetic field generated from the bus bar 3 remains parallel to the magnetic sensing surface of the magnetoelectric transducer 6a. That is, even if the position of the magnetoelectric transducer is misaligned in parallel to the wide side surface of the bus bar 3 to some extent, the influence that the magnetoelectric transducer 6a receives from the bus bar 3 is hard to change. That is, even if the position of the magnetoelectric transducer 6a is misaligned, the magnetoelectric transducer 6a is hard to be affected by disturbance. All the above-mentioned points contribute to restraining the influence that the magnetoelectric transducer 6a receives from the bus bar 3 adjacent to the bus bar 2 as the current measurement target.

In addition, when the notch is provided on a narrower side surface of the bus bar having a flat section, it is possible to deepen the notch in comparison with a case where the notch is provided on a wider side surface. This increases a degree of freedom of a placement position of the magnetoelectric transducer.

Figure 11:
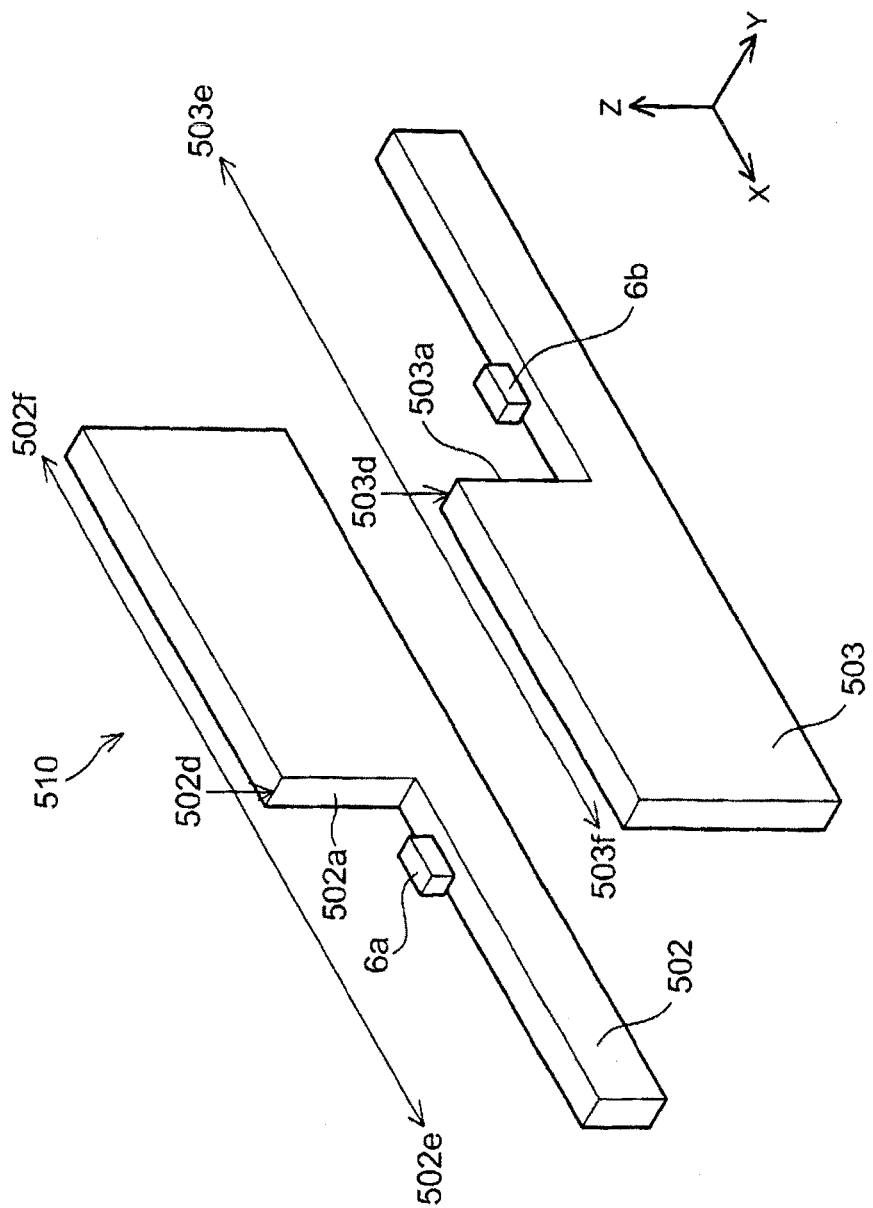
FIG. 11 is a perspective view of a bus bar (bus bar module) of a fourth modification.

Next will be described a bus bar module 510 of a fourth modification with reference to FIG. 11. The fourth modification relates to the bus bar module 510 having two bus bars. Two bus bars (a first bus bar 502 and a second bus bar 503) are placed in parallel to each other. The first bus bar 502 includes a step 502d changing from a thick part 502f into a thin part 502e toward one side in a bus-bar extending direction (a positive direction of the X-axis in the figure). The second bus bar 503 includes a step 503d changing from a thin part 503e into a thick part 503f toward the one side in the bus-bar extending direction (the positive direction of the X-axis in the figure).

A magnetoelectric transducer 6a for detecting a magnetic flux caused due to a current flowing through the first bus bar 502 is placed so as to be opposed to the thin part 502e of the first bus bar 502. A magnetoelectric transducer 6b for detecting a magnetic flux (current) caused due to a current flowing through the second bus bar 503 is placed so as to be opposed to the thin part 503e of the second bus bar 503. The thin part 502e of the first bus bar 502 is adjacent to the thick part 503f of the second bus bar 503. The thin part 503e of the second bus bar 503 is adjacent to the thick part 502f of the first bus bar 502. That is, a sectional area (a sectional area of the thin part 502e) of the first bus bar 502 in a section passing through the magnetoelectric transducer 6a is smaller than a sectional area (a sectional area of the thick part 503f) of the second bus bar 503. Further, a sectional area (a sectional area of the thin part 503e) of the second bus bar 503 in a section passing through the magnetoelectric transducer 6b is smaller than a sectional area (a sectional area of the thick part 502f) of the first bus bar 502. An SN ratio (an SN ratio of magnetic flux detection) of current measurement of the bus bar module 510 is also higher than that of the conventional current measuring device, similarly to the bus bar modules described above.

A characteristic structure of the bus bar module 510 of the fourth modification can be expressed as follows. The first bus bar 502 of the bus bar module 510 includes the step 502d changing from the thick part 502f into the thin part 502e toward one side in its extending direction. The second bus bar 503 includes the step 503d changing from the thin part 503e into the thick part 503f toward the one side. The magnetoelectric transducer 6a is opposed to the thin part 502e of the first bus bar 502. The first section of the second bus bar 503 is a section of the thick part 503f.

Figure 12:
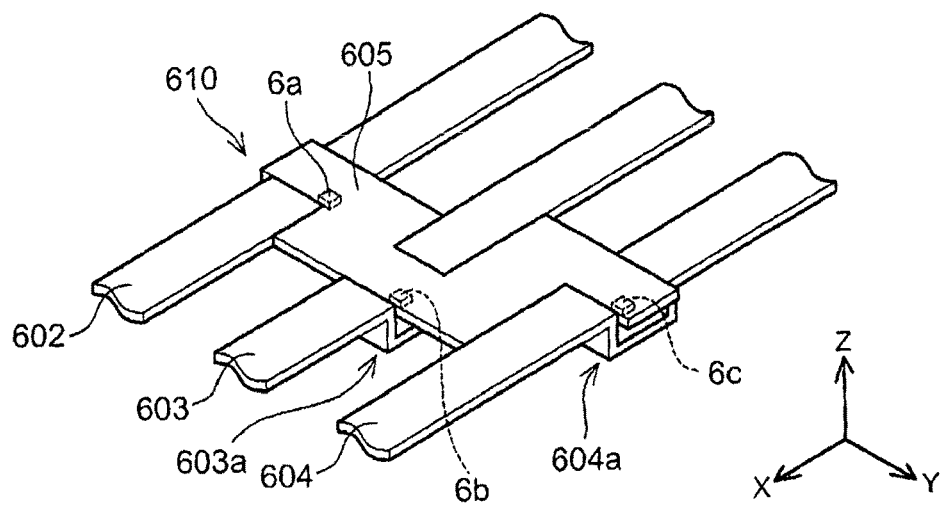
FIG. 12 is a perspective view of a bus bar (bus bar module) of a fifth modification.
Figure 13:
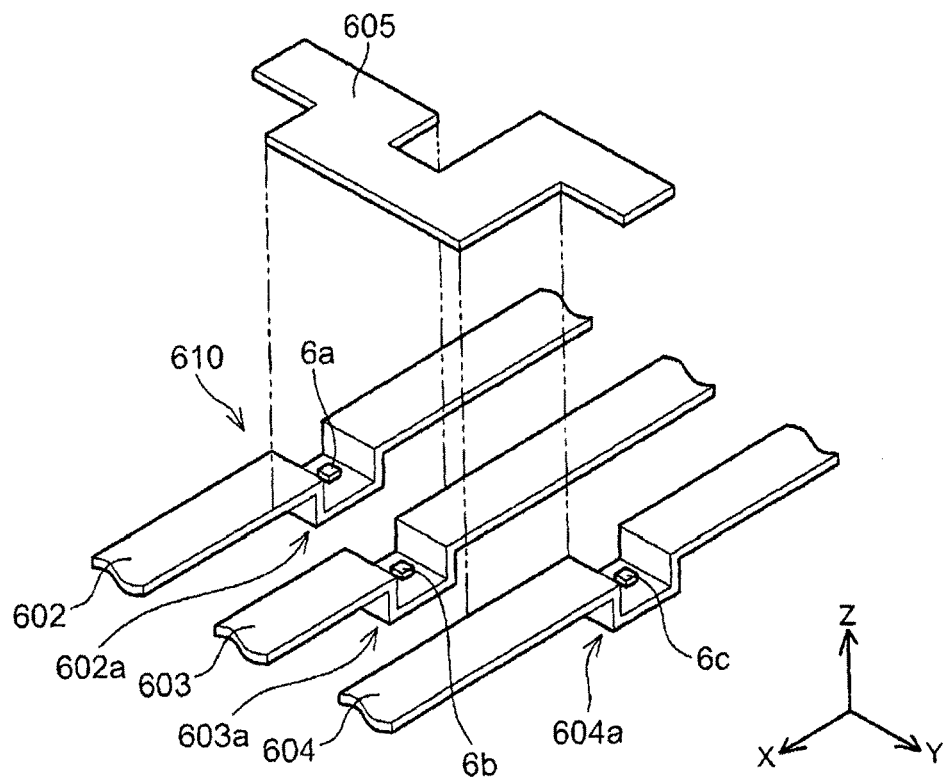
FIG. 13 is a perspective view of the bus bar (bus bar module) of the fifth modification (a state where a substrate is removed).

With reference to FIGS. 12 and 13, the following describes a bus bar module 610 of a fifth modification. FIG. 12 is a perspective view of the bus bar module 610, and FIG. 13 is a perspective view of the bus bar module 610 in a state where a sensor substrate 605 is removed. Similarly to the figures of the above modifications, a whole bus bar module is not illustrated in FIGS. 12 and 13, and only a part where magnetoelectric transducers for three bus bars are provided is illustrated therein.

In the bus bar module 610, a plurality of bus bars 602, 603, 604 are placed so that their narrow side surfaces are opposed to each other. The bus bars are provided with bending portions 602a, 603a, 604a, respectively, so that their respective wide side surfaces are hollowed. The bending portion is formed such that part of the bus bar extending in a positive direction of the X-axis is bent in a negative direction of the Z-axis, then bent in the positive direction of the X-axis, further bent in a positive direction of the Z-axis, and finally bent in the positive direction of the X-axis again. More specifically, the bending portion is bent in a crank shape based on the extending direction such that the bending portion is bent in one direction at 90 degrees, then bent at −90 degrees, further bent at −90 degrees, and finally bent at 90 degrees. Further, in other words, the bending portion is a part that is bent so that a hollow is formed in the bus bar. Due to such a bend, a hollow is formed on the wide side surface of the bus bar. A sensor substrate 605 is fitted to the hollow (the bending portion) of each of the bus bars and is sandwiched between a pair of facing surfaces of adjacent bus bars. Further, magnetoelectric transducers are fixed to the sensor substrate 605 so that the magnetoelectric transducers 6a to 6c are placed inside the bending portions of respective bus bars.

In the bus bar module of the fifth modification, the bending portion is formed such that the wide side surface of the bus bar is bent in an outersurface direction. Accordingly, the hollow having a width of the wide side surface is formed in each of the bus bars, and the sensor substrate 605 is fitted to the hollow. As illustrated well in FIGS. 12, 13, the sensor substrate makes contact with each of the bus bars with a long distance in each of the X-axis direction and the Y-axis direction. Accordingly, the plurality of bus bars is hard to move relative to each other, so that their relative positional relationship is maintained well.

The following describes a point to keep in mind in regard to the technique described in the above embodiment. The bus bar module of the embodiment includes: a first bus bar and a second bus bar placed in parallel to each other; a first magnetoelectric transducer placed so as to be opposed to a side surface of the first bus bar; and a second magnetoelectric transducer placed so as to be opposed to a side surface of the second bus bar. A sectional area of the first bus bar is smaller than a sectional area of the second bus bar in a section passing through the first magnetoelectric transducer and perpendicular to an extending direction of the first and second bus bars. Further, a sectional area of the second bus bar is smaller than a sectional area of the first bus bar in a section passing through the second magnetoelectric transducer and perpendicular to the extending direction of the first and second bus bars. Generally speaking, the technique of the embodiment increases an SN ratio of current measurement at a point to detect a magnetic field by configuring the bus bars parallel to each other to have relatively different sectional areas.

The embodiment relates to a bus bar module for use in transmission of an output of an inverter. The bus bar module described in the present specification is also applicable to devices other than the inverter.

The bus bar 2 in the bus bar module of FIGS. 1 to 4 corresponds to an example of the first bus bar, and the bus bar 3 therein corresponds to an example of the second bus bar. Further, the magnetoelectric transducer 6a placed in the notch 2a of the bus bar 2 corresponds to an example of the first magnetoelectric transducer, and the magnetoelectric transducer 6b placed in the notch 3a of the bus bar 3 corresponds to an example of the second magnetoelectric transducer.

The technique described in the present specification is applicable to a bus bar module having two or more bus bars, and the number of bus bars is not limited in particular. For example, an inverter for supplying electric power to two three-phase circuit motors includes six bus bars in total. The technique described in the present specification is also applicable to a bus bar module including six or more bus bars.

The electrically-driven vehicle in the present specification includes an electric vehicle, a hybrid vehicle, and a fuel-cell vehicle.

The concrete embodiment of the invention have been described in detail, but these embodiments are only examples and do not limit the invention according to Claims. A technique according to Claims includes embodiments obtained by variously modifying or altering the concrete embodiments exemplified as above. Technical elements described in the present specification or the drawings exhibit a technical usability solely or in various combinations, and are not limited to combinations as described in Claims as of filing the present application. Further, the technique exemplified in the present specification or the drawings can achieve a plurality of objects at the same time, and has a technical usability by achieving one of those objects.

The invention claimed is:

1. A bus bar module equipped with a current sensor, the bus bar module comprising:
   a first bus bar having a first notch;
   a second bus bar having a second notch, the second bus bar being placed in parallel to the first bus bar, and the second notch being provided at a position different from the first notch in an extending direction of the first bus bar;
   a substrate fitted to both the first notch and the second notch, the substrate being sandwiched between side surfaces of the first bus bar and the second bus bar, the side surfaces being opposed to each other; and
   a first magnetoelectric transducer placed inside the first notch and fixed to the substrate,
   wherein the substrate covers an entire area of the first notch and the second notch.

2. The bus bar module according to claim 1, wherein
   in a first section view, the first magnetoelectric transducer is placed on a straight line passing through a center of a section of the second bus bar and extending in an aligning direction of the first bus bar and the second bus bar,
   the first section view is a section passing through the first magnetoelectric transducer and perpendicular to the extending direction of the first bus bar.

3. The bus bar module according to claim 1, wherein
   each of the first bus bar and the second bus bar has a flat section, and each of the first bus bar and the second bus bar has a first side surface and a second side surface,
   the first side surfaces being wider than the second side surfaces,
   the first bus bar and the second bus bar are placed in parallel to each other such that the respective first side surfaces are opposed to each other,
   the first notch is provided on the second side surface of the first bus bar, and
   the second notch is provided on the second side surface of the second bus bar which is on the same side as the first notch.

4. The bus bar module according to claim 1, wherein
   in a first section view, a sectional area of the first bus bar is smaller than a sectional area of the second bus bar,
   the first section view is a section view passing through the first magnetoelectric transducer and perpendicular to the extending direction of the first bus bar.

5. The bus bar module according to claim 1, further comprising a second magnetoelectric transducer placed inside the second notch and fixed to the substrate.

6. A bus bar module equipped with a current sensor, the bus bar module comprising:
   a first bus bar having a first bending portion having a crank-shape;

a second bus bar having a second bending portion having a crank-shape, the second bus bar being placed in parallel to the first bus bar, and the second bending portion being provided at a position different from the first bending portion in an extending direction of the first bus bar;

a substrate fitted to both the first bending portion and the second bending portion, the substrate being sandwiched between side surfaces of the first bus bar and the second bus bar, the side surfaces being opposed to each other;

first magnetoelectric transducer placed inside the first bending portion and fixed to the substrate; and a second magnetoelectric transducer placed inside the second bending portion and fixed to the substrate, wherein the substrate covers an entire area of the first bending portion and the second bending portion.

7. The bus bar module according to claim 1, wherein the surface of each bus bar defines a main surface and a side surface, and the main surfaces of each bus bar are wider than the side surfaces of each bus bar.

8. The bus bar module according to claim 1, wherein the first notch is formed by cutting a part of the first bus bar, and the second notch is formed by cutting a part of the second bus bar.

* * * * *